(12) United States Patent　(10) Patent No.: US 7,507,101 B2
Chiang　(45) Date of Patent: Mar. 24, 2009

(54) SOCKET CONNECTOR

(75) Inventor: Chun-Hsiang Chiang, Taipei Hsien (TW)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 11/788,142

(22) Filed: Apr. 18, 2007

(65) Prior Publication Data

US 2007/0254500 A1　Nov. 1, 2007

(30) Foreign Application Priority Data

Apr. 18, 2006　(TW) ............................. 95206553 U

(51) Int. Cl.
*H01R 13/62*　(2006.01)
(52) U.S. Cl. ........................................ 439/331; 439/71
(58) Field of Classification Search ................. 439/331, 439/330, 525, 526, 70–73
See application file for complete search history.

(56) References Cited

U.S. PATENT DOCUMENTS

| | | | | |
|---|---|---|---|---|
| 4,278,311 A | * | 7/1981 | Scheingold et al. | ........... 439/71 |
| 4,341,433 A | * | 7/1982 | Cherian et al. | .............. 439/525 |
| 4,692,790 A | * | 9/1987 | Oyamada | ..................... 257/727 |
| 4,761,140 A | * | 8/1988 | Geib | ............................ 439/71 |
| 5,603,629 A | * | 2/1997 | DeFrasne et al. | ............ 439/331 |
| 5,785,535 A | * | 7/1998 | Brodsky et al. | ............... 439/73 |
| 6,802,728 B1 | * | 10/2004 | Howell et al. | ................ 439/160 |
| 7,014,477 B2 | * | 3/2006 | Tsai | ............................. 439/71 |
| 7,083,456 B2 | * | 8/2006 | Trout et al. | ................. 439/326 |
| 7,179,092 B2 | | 2/2007 | Ma | |
| 7,255,605 B2 | * | 8/2007 | Chen et al. | .................. 439/630 |

\* cited by examiner

*Primary Examiner*—Hien Vu
(74) *Attorney, Agent, or Firm*—Robert J. Zeitler

(57) ABSTRACT

A socket connector that is capable of supporting and blocking a chip module therein includes an insulating body, a plurality of conductive terminals and a plate-like blocking frame. The conductive terminals are provided in the insulating body. Four sides of the plate-like blocking frame enclose to form an accommodating space. The rear portion of the plate-like blocking frame is pivotally connected to the rear portion of the insulating body. The front portion of the plate-like blocking frame is locked to the front portion of the insulating body. Two adjacent sides of the plate-like blocking frame extend respectively to form a piece body having an abutting portion. The abutting portion extends into the accommodating space, so that the chip module can be pushed in position accurately to obtain a good electrical connection with the socket connector.

17 Claims, 6 Drawing Sheets

SOCKET CONNECTOR

FIELD OF THE INVENTION

The present invention relates to a socket connector, and in particular to a socket connector for pushing a chip module supported thereon in position, thereby obtaining a good electrical connection.

BACKGROUND OF THE INVENTION

A chip module having the standard of Land Grid Array Package, such as a central processor of a computer host, is mounted on a socket connector of a circuit board. The socket connector includes an insulating body, a plurality of conductive terminals and a locking assembly. The plurality of conductive terminals is provided in the insulating body. The insulating body supports a chip module thereon. The locking assembly presses the chip module on the insulating body. In this way, electric contacts on the bottom surface of the chip module can be brought into electrical contact with conductive terminals of the insulating body, and thus is electrically connected to the circuit board via these conductive terminals.

The top surface of the chip module is coated with a layer of adhesive heat-dissipating paste. A heat dissipator is disposed on the socket connector to contact with the heat-dissipating paste coated on the top surface of the chip module, thereby dissipating the heat generated by the chip module.

When the heat dissipator is picked up, the locking assembly blocks the chip module. In this way, the chip module can be avoided from being picked up together with the heat dissipator and can be avoided from the later falling and damage.

Taiwan Patent Publication No. M257534, published on Feb. 21, 2005, discloses a conventional socket connector, which includes an insulating base, a frame, a pressing cover and a poking rod. The insulating base is provided with a receiving portion and a mounting portion. The receiving portion accommodates the chip module therein. The side edge of the mounting portion is provided with a plurality of projecting points. The inside edge of a hollow bottom wall of the frame is provided with a plurality of troughs. The protruding points mate with the troughs, respectively, so that the insulating base is combined with the frame and the pressing cover and the poking rod are pivotally connected to two opposing ends of the frame.

When the chip module is disposed in the socket connector, the dimension of the space of the receiving portion that accommodates the chip module is slightly larger than the dimension of the chip module, so that it is easier to dispose the chip module in the socket connector. However, owing to this clearance, the chip module is movable in the socket connector and thus cannot be positioned accurately. Accordingly, the electric contacts on the bottom surface of the chip module may deviate from the conductive terminals of the insulating base easily. As a result, the chip module cannot be brought into electrical connection with the socket connector normally and thus cannot exhibit the performance thereof. According to the above, in practice, the above-mentioned socket connector really has some inconvenience and problems and thus needs to be improved.

SUMMARY OF THE INVENTION

A socket connector includes an insulating body, a plurality of conductive terminals provided in the insulating body, and a plate-like blocking frame with four sides thereof enclosing to form an accommodating space. The rear portion of the plate-like blocking frame is pivotally connected to the rear portion of the insulating body. The front portion of the plate-like blocking frame is locked to the front portion of the insulating body. Two adjacent sides of the plate-like blocking frame extend to form a piece body. The piece body has an abutting portion extending into the accommodating space.

In order to better understand the characteristics and technical contents of the present invention, a detailed description thereof will be made with reference to the accompanying drawings. However, it should be understood that the drawings and the description are illustrative but not used to limit the scope of the present invention.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE INVENTION

Figure 1:
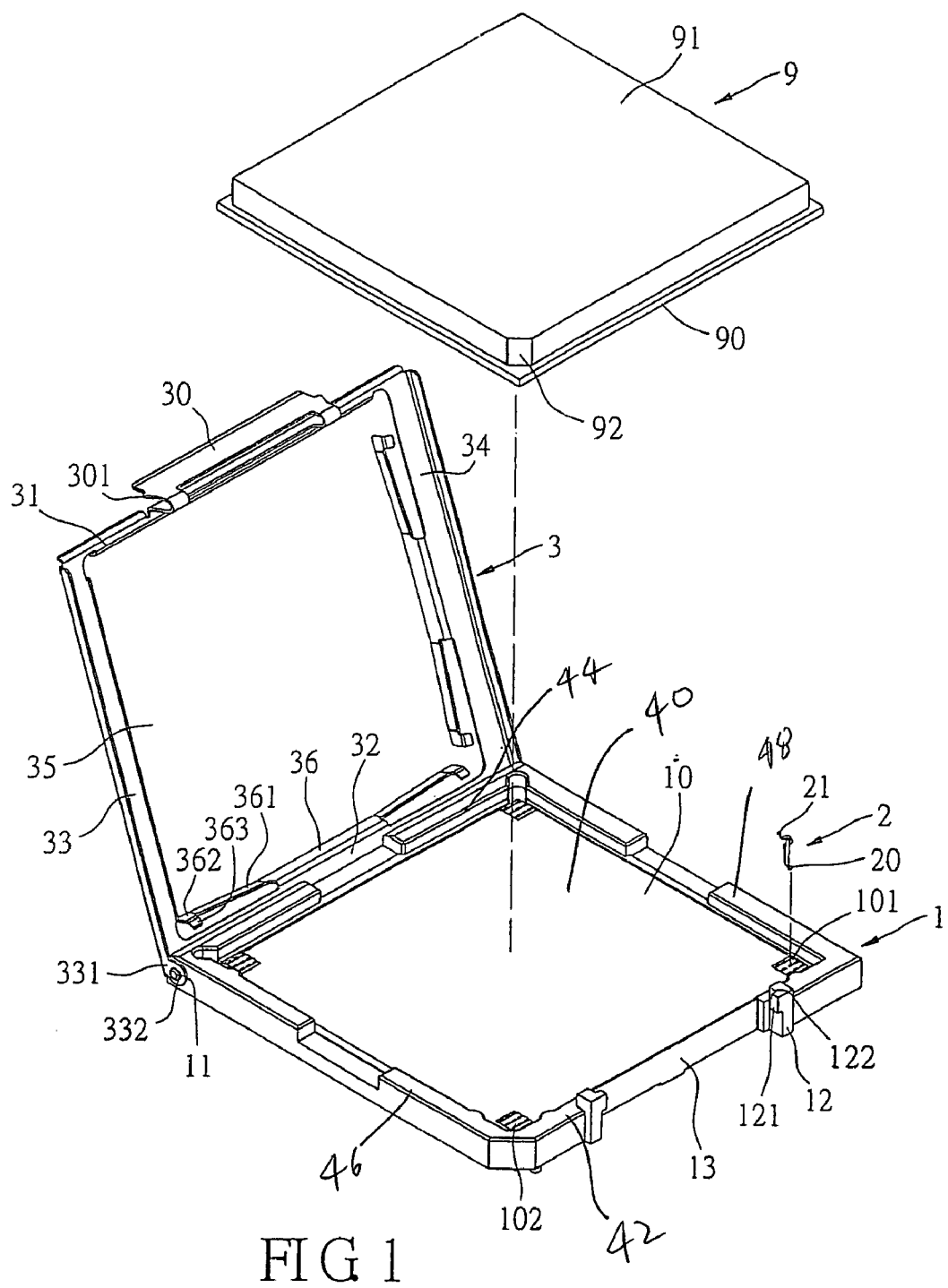
FIG. 1 is a perspective view showing the socket connector in accordance with the first embodiment of the present invention and a chip module.

While this invention may be susceptible to embodiment in different forms, there is shown in the drawings and will be described herein in detail, specific embodiments with the understanding that the present disclosure is to be considered an exemplification of the principles of the invention, and is not intended to limit the invention to that as illustrated.

The socket connector of the present invention can support and block a chip module 9 therein. The chip module 9 can be a chip module having the specification of Land Grid Array Package, such as a central processor of a computer host. The chip module is provided with a printed circuit board 90 and a heat dissipator 91. The heat dissipator 91 is fixedly provided on an upper end of the printed circuit board 90, and the lower left corner thereof has a chamfer 92. The chamfer 92 acts as a fool-proofing means for indicating the corner in which a first terminal of the chip module 9 is located.

Figure 2:
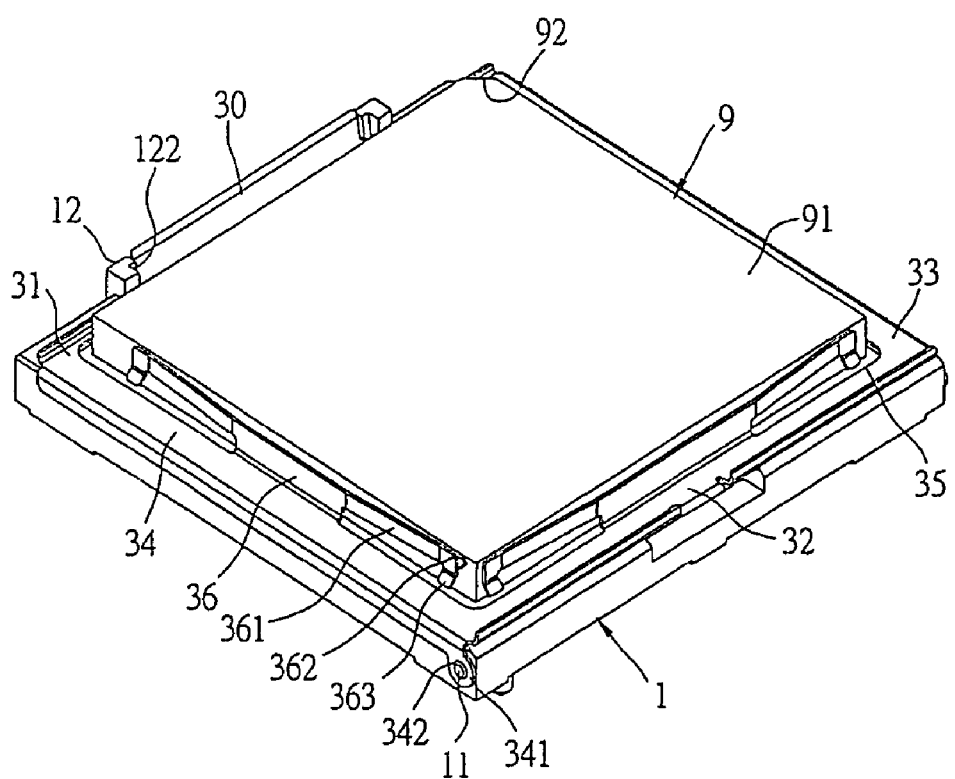
FIG. 2 is a perspective view showing that the socket connector in accordance with the first embodiment of the present invention is combined with a chip module.

With reference to FIGS. 1 and 2, the socket connector in accordance with the first embodiment of the present invention includes an insulating body 1, a plurality of conductive terminals 2 and a plate-like blocking frame 3.

The insulating body 1 is formed into a rectangular shape and has a base wall 40, a front wall 42 extending upwardly from the base wall 40, a rear wall 44 extending upwardly from the base wall 40, a left side wall 46 extending upwardly from the base wall 40, and a right side wall 48 extending upwardly from the base wall 40. The walls 40,42,44,46,48 from a recessed mounting portion 10. The mounting portion 10 is provided with a plurality of terminal troughs 101. The lower left corner of the mounting portion 10 is provided with a chamfer 102. The chamfer 102 corresponds to the chamfer 92 of the chip module 9. Two ends of the rear portion of the insulating body 1 are each provided with a protruding shaft 11.

The front portion of the insulating body 1 is provided with a locking device. The locking device has two protruding blocks 12, two blocking portions 121 and two recessed troughs 122. The insulating body 1 is provided with a notch 13 between the protruding blocks 12. The blocking portions 121 are formed on upper edges of the opposing insides of the protruding blocks 12. The recessed troughs 122 are formed on the rear sides of the blocking portions 121.

The conductive terminals 2 are formed in the terminal troughs 101 of the mounting portion 10. Each conductive terminal 2 is a SMT terminal (Surface Mount Technology). The bottom end and the top end of each conductive terminal 2 have a welding portion 20 and a contacting portion 21, respectively. Each welding portion 20 is used to weld a solder ball onto a circuit board (not shown). Each contacting portion 21 is brought into electrical contact with the chip module 9.

The plate-like blocking frame 3 has a front blocking plate 31, a rear blocking plate 32, a left blocking plate 33 and a right blocking plate 34. The front blocking plate 31 and the rear blocking plate 32 are located in the front and rear portions of the plate-like blocking frame 3, respectively. Both ends of the left and right blocking plates 33, 34 are connected respectively to both ends of the front and rear blocking plates 31, 32. The front blocking plate 31, the rear blocking plate 32, the left blocking plate 33 and the right blocking plate 34 enclose to form a closed rectangular outer frame and an inner accommodating space 35.

A piece body 36 extends vertically and upwardly from the central position of the inside of the rear blocking plate 32 and the right blocking plate 34 of the plate-like blocking frame 3. Both ends of each piece body 36 extend to form an abutting portion 361, respectively. The abutting portion 361 extends into the accommodating space 35 and has a pushing surface 362. The bottom of the abutting portion 361 obliquely forms a guiding plate 363.

Furthermore, the rear portion of the plate-like blocking frame 3 has a left pivoting piece 331 and a right pivoting piece 341. The left pivoting piece 331 and the right pivoting piece 341 are connected respectively to the rear ends of the left and right blocking plates 33, 34. The left pivoting piece 331 and the right pivoting piece 341 are each provided with a left pivoting hole 332 and a right pivoting hole 342. The two pivoting holes 332, 342 are pivotally connected to the protruding shafts 11, so that the rear portion of the plate-like blocking frame 3 is pivotally connected to the rear portion of the insulating body 1.

The front portion of the plate-like blocking frame 3 has an elastic locking device. The elastic locking device has a U-shaped elastic arm 30. The rear end of the elastic arm 30 is connected to the front edge of the front blocking plate 31. The front end of the elastic arm 30 is a free end and has two hooks 301 that are located at both sides of the elastic arm.

When the chip module 9 is mounted to the socket connector of the present invention, the chip module 9 is disposed in the mounting portion 10 of the insulating body 1. Then, the plate-like blocking frame 3 is covered. The two piece bodies 36 guide the chip module 9 to displace via the two guiding plates 363. Via the downward displacement of the plate-like blocking frame 3, the pushing surfaces 362 are pushed to abut against the right and rear surfaces of the heat dissipator 91 of the chip module 9. As a result, the chip module 9 is pushed toward the chamfer 102 of the mounting portion 10 stably via the right and rear sides thereof. Accordingly, the plate-like blocking frame 3 can push the chip module 9 to abut against two adjacent sides of the lower left corner of the insulating body 1, so that the chip module 9 can be pushed in position to obtain a good electrical contact with the conductive terminals 2.

At this time, the front portion of the plate-like blocking frame 3 covers the front portion of the insulating body 1, and the free end of the elastic arm 30 is pressed to move downwardly, so that the hooks 301 pass through the recessed troughs 122 respectively. Subsequently, the free ends of elastic arm 30 are released, so that the hooks 301 of the free end of the elastic arm 30 are hooked under the blocking portions 121 of the locking device of the insulating body 1. The elastic locking device is accommodated in the notch 13, so that the elastic locking device on the front portion of the plate-like blocking frame 3 is detachably locked to the locking device on the front portion of the insulating body 1.

Therefore, via the front, rear, left and right blocking plates 31, 32, 33, 34 of the plate-like blocking frame 3, the chip module 9 is blocked on the insulating body 1. Also, the top surface of the chip module 9 corresponds to the accommodating space 35 of the plate-like blocking frame 3.

Figure 3:
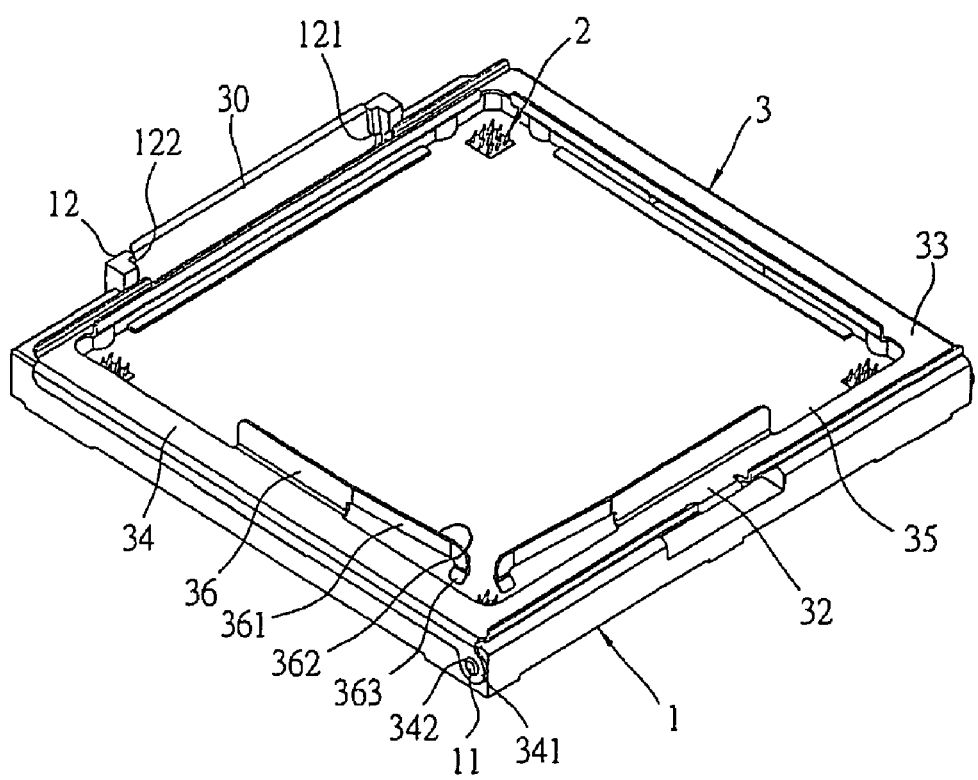
FIG. 3 is a perspective view showing the socket connector in accordance with the second embodiment of the present invention.

Please refer to FIG. 3, which shows the second embodiment of the socket connector of the present invention. The difference between the first embodiment and the second embodiment lies in that each piece body 36 extends only from one end closer to the right pivoting hole 342 to form an abutting portion 361 having a pushing surface 362.

When the plate-like blocking frame 3 covers downwardly, the pushing surfaces 362 of the two abutting portions 361 abut against the corner adjacent to the right and rear surfaces of the heat dissipator 91 of the chip module 9, so that the chip module 9 is pushed in position via the right and rear sides thereof.

Figure 4:
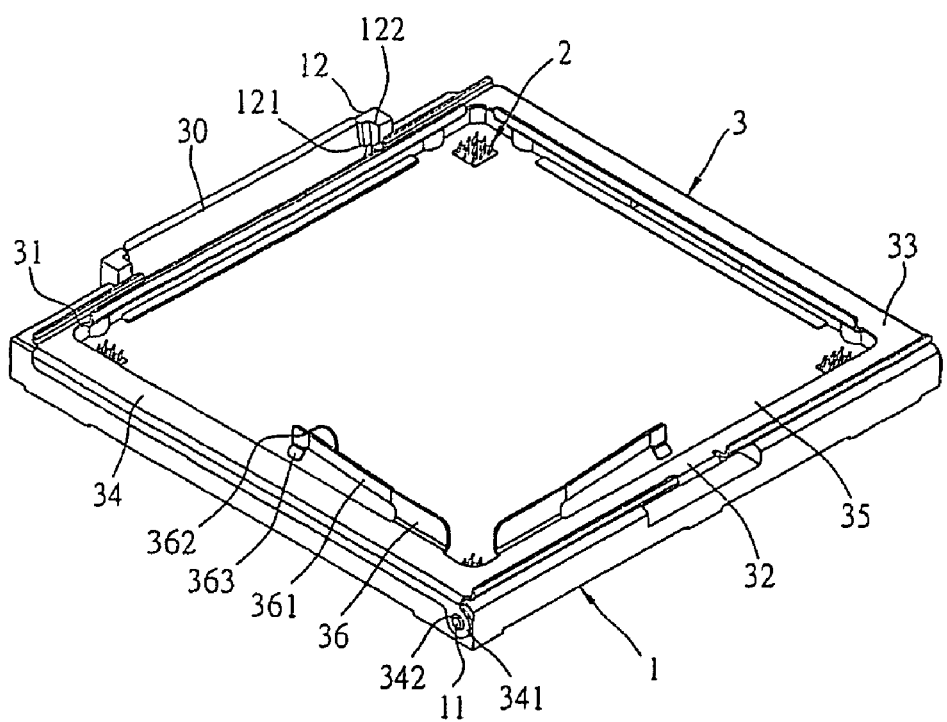
FIG. 4 is a perspective view showing the socket connector in accordance with the third embodiment of the present invention.

Please refer to FIG. 4, which shows the third embodiment of the socket connector of the present invention. The difference between the third embodiment and the second embodiment lies in that the two piece bodies 36 extend from the insides of the rear blocking plate 32 and the right blocking plate 34 adjacent to the right pivoting hole 342. The two pieces bodies 36 extend in a direction toward the center of the rear blocking plate 32 and the right blocking plate 34 respectively to form an abutting portion 361. The abutting portion 361 has a pushing surface 362 located in the accommodating space 35.

When the plate-like blocking frame 3 covers downwardly, the pushing surfaces 362 of the two abutting portions 361 abut against the central portions of the right and rear surfaces of the heat dissipator 91 of the chip module 9, so that the chip module 9 can be pushed in position via the right and rear sides thereof.

Figure 5:
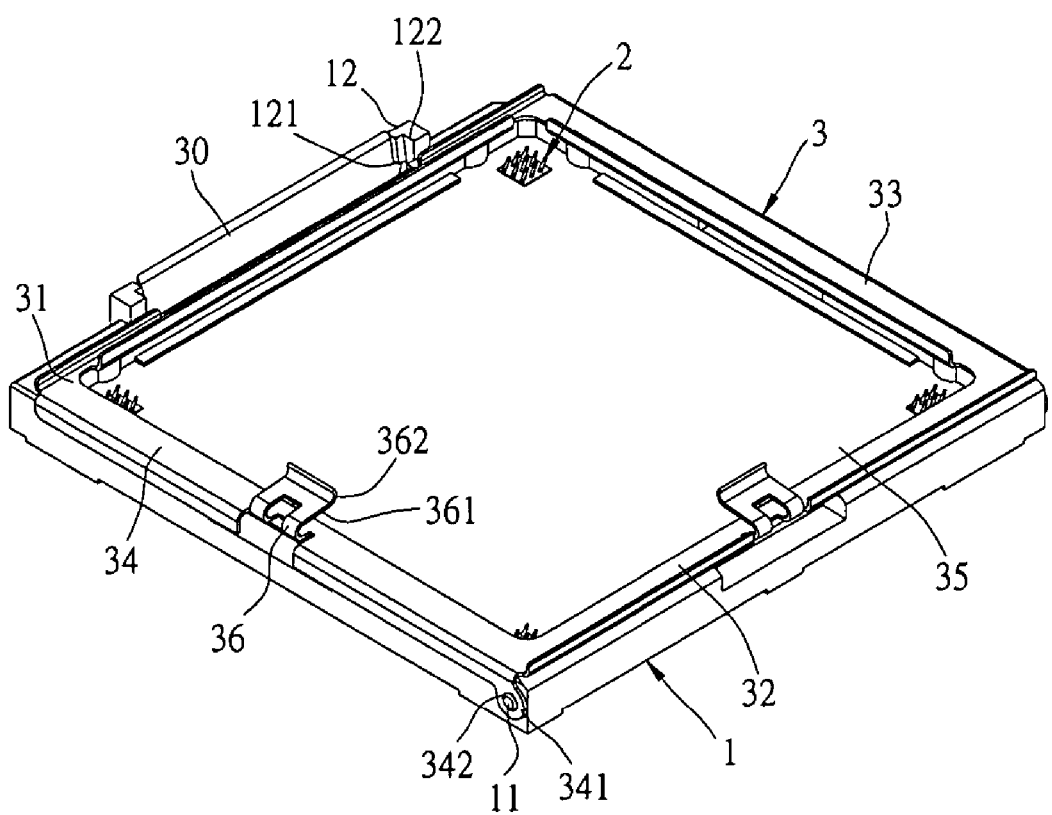
FIG. 5 is a perspective view showing the socket connector in accordance with the fourth embodiment of the present invention.

Please refer to FIG. 5, which shows the fourth embodiment of the socket connector of the present invention. The difference between the fourth embodiment and the first embodiment lies in that each piece body 36 is formed into U-shaped. The two piece bodies 36 pass through the upsides of the rear blocking plate 32 and the right blocking plate 34, respectively, and each extends toward the accommodating space 35 to form an abutting portion 361. The abutting portion 361 is bent upwardly to form a pushing surface 362.

When the plate-like blocking frame 3 covers downwardly, the pushing surfaces 362 of the two abutting portions 361 abut against the central portions of the right and rear surfaces of the heat dissipator 91 of the chip module 9, so that the chip module 9 can be pushed in position via the right and rear sides thereof.

Figures 6, 6A:
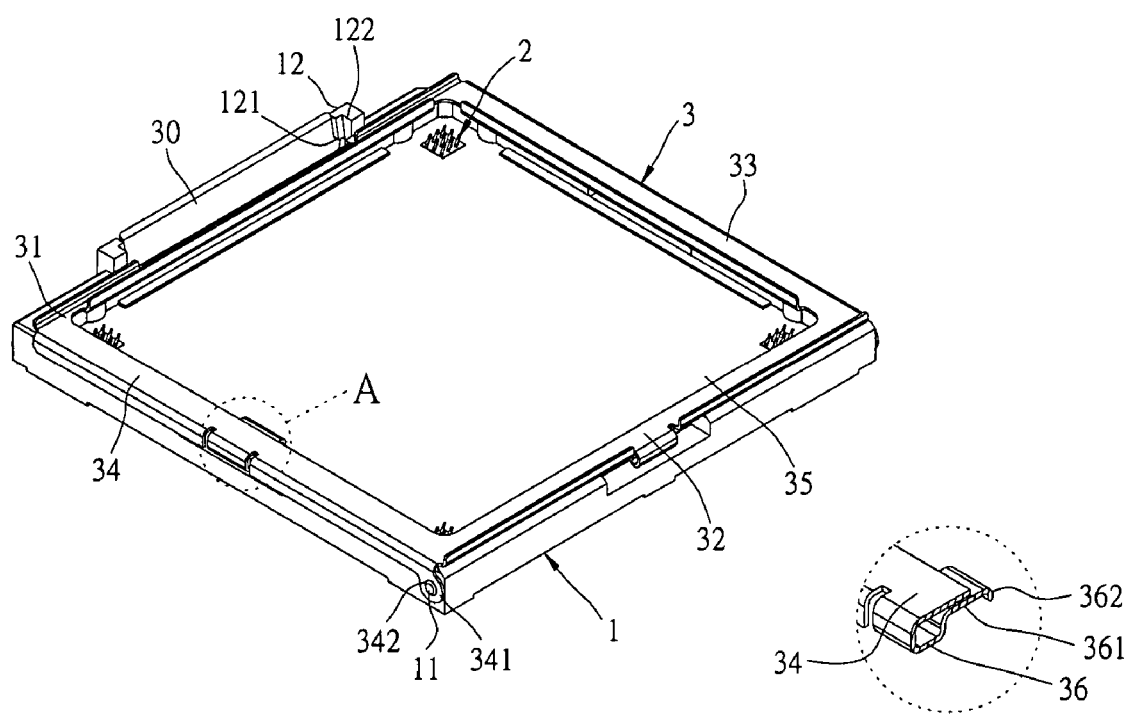
FIG. 6 is a perspective view showing the socket connector in accordance with the fifth embodiment of the present invention.
FIG. 6A is a view showing the details of the portion A in FIG. 6.

Please refer to FIGS. 6 and 6A, which show the fifth embodiment of the socket connector of the present invention. The difference between the fifth embodiment and the fourth embodiment lies in that the two piece bodies 36 pass through the undersides of the rear blocking plate 32 and the right blocking plate 34, and each extends toward the accommodating space 35 to form an abutting portion 361. The abutting portion 361 is bent downwardly to form a pushing surface 362.

When the plate-like blocking frame 3 covers downwardly, the pushing surfaces 362 of the two abutting portions 361 abut against the central portions of the right and rear surfaces of the heat dissipator 91 of the chip module 9, so that the chip module 9 can be pushed in position via the right and rear sides thereof.

Therefore, in the socket connector of the present invention, the piece bodies 36 extending from the plate-like blocking frame 3 can push the chip module 9 to move toward two adjacent sides of the lower left corner of the insulating body 1 upon the insertion of the chip module 9. As a result, the chip module 9 will not be deviated from the conductive terminals 2 and thus produces a good electrical contact with the conductive terminals 2. Therefore, the chip module 9 can be electrically connected with the socket connector of the present invention firmly and thus exhibit the performance thereof.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

While preferred embodiments of the invention are shown and described, it is envisioned that those skilled in the art may devise various modifications without departing from the spirit and scope of the foregoing description and the appended claims.

What is claimed is:

1. A socket connector into which a chip module can be inserted, the chip module having an upper surface, a lower surface and side edges extending between the upper and lower surfaces, said socket connector comprising:
    an insulating body having a base wall, a front wall extending upwardly from said base wall, a rear wall extending upwardly from said base wall, a left side wall extending upwardly from said base wall, and a right side wall extending upwardly from said base wall, said walls forming a recess, the chip module being insertable into the recess such that the lower surface of the chip module faces the base wall and the side edges of the chip module face respective ones of the front, rear, left side and right side walls;
    a plurality of conductive terminals provided in the insulating body; and
    a plate-like blocking frame including a front blocking plate, a rear blacking plate, a left side blocking plate and a right side blocking plate which are connected together to form an accommodating space for mounting the chip module therein, said left side blocking plate extending between said front blocking plate and said rear blocking plate such that said left side blocking plate is adjacent to said front blocking plate and adjacent to said rear blocking plate, said right side blocking plate extending between said front blocking plate and said rear blocking plate such that said right side blocking plate is adjacent to said front blocking plate and adjacent to said rear blocking plate, a rear portion of the plate-like blocking frame being pivotally connected to a rear portion of the insulating body such that said plate-like blocking frame can be pivoted from an open position to a closed position relative to said insulating body, a front portion of the plate-like blocking frame capable of being locked to a front portion of the insulating body when said plate-like blocking frame is in the closed position relative to said insulating body, a first piece body extending from one of said blocking plates, a second piece body extending from another one of said blocking plates which is adjacent to the blocking plate from which the first piece body extends, each said piece body having an abutting portion which extends into the accommodating space and is capable of abutting one of the side edges of the chip module when the chip module is inserted into the socket connector to bias the chip module toward the blocking plates to which the piece bodies are not attached.

2. The socket connector according to claim 1, wherein the front portion of the insulating body is provided with a locking device, the front portion of the plate-like blocking frame has an elastic locking device, and the elastic locking device is detachably locked to the locking device.

3. The socket connector according to claim 1, wherein each blocking plate has an upper surface and a lower surface, the lower surface of each blocking plate being proximate to said walls of said insulating body when said plate-like blocking frame is in the closed position, and each piece body extends above the upper surface of the blocking plate to which said piece body is attached.

4. The socket connector according to claim 1, wherein each blocking plate has an upper surface and a lower surface, the lower surface of each blocking plate being proximate to said walls of said insulating body when said plate-like blocking frame is in the closed position, and each piece body extends below lower surface of the blocking plate to which said piece body is attached.

5. The socket connector according to claim 1, further including a guiding plate attached to each said abutting portion, each said guiding plate being angled relative to said respective abutting portion, each said guiding portion being capable of contacting the respective side edge of the chip module during movement of the plate-like blocking frame from the open position to the closed position.

6. The socket connector according to claim 1, wherein each said piece body has first and second ends, and an abutting portion extends from each said end of the respective piece body.

7. The socket connector according to claim 1, wherein each said piece body has first and second ends, and the abutting portion extends from one of said ends of the respective piece body.

8. The socket connector according to claim 7, wherein each said abutting portion is formed at the end of the respective piece body which is adjacent to each other.

9. The socket connector according to claim 7, wherein each said abutting portion is formed at the end of the respective piece body which is not adjacent to each other.

10. In combination, a socket connector and a chip module comprising:

a chip module having an upper surface, a lower surface and side edges extending between the upper and lower surfaces; and a socket connector including an insulating body having a base wall, a front wall extending upwardly from said base wall, a rear wall extending upwardly from said base wall, a left side wall extending upwardly from said base wall, and a right side wall extending upwardly from said base wall, said walls forming a recess, the chip module being insertable into the recess such that the lower surface of the chip module faces the base wall and the side edges of the chip module face respective ones of the front, rear, left side and right side walls, a plurality of conductive terminals provided in the insulating body, and a plate-like blocking frame including a front blocking plate, a rear blocking plate, a left side blocking plate and a right side blocking plate which are connected together to form an accommodating space for mounting the chip module therein, said left side blocking plate extending between said front blocking plate and said rear blocking plate such that said left side blocking plate is adjacent to said front blocking plate and adjacent to said rear blocking plate, said right side blocking plate extending between said front blocking plate and said rear blocking plate such that said right side blocking plate is adjacent to said front blocking plate and adjacent to said rear blocking plate, a rear portion of the plate-like blocking frame being pivotally connected to a rear portion of the insulating body such relative to said insulating body, a front portion of the plate-like blocking frame capable of being locked to a front portion of the insulating body when said plate-like blocking frame is in the closed position relative to said insulating body, a first piece body extending from one of said blocking plates, a second niece body extending from another one of said blocking plates which is adjacent to the blocking plate from which the first piece body extends, each said piece body having an abutting portion which extends into the accommodating space and is capable of abutting one of the side edges of the chip module when the chip module is inserted into the socket connector to bias the chip module toward the blocking plates to which the piece bodies are not attached.

11. The combination according to claim 10, wherein the front portion of the insulating body is provided with a locking device, the front portion of the plate-like blocking frame has an elastic locking device, and the elastic locking device is detachably locked to the locking device.

12. The combination according to claim 10, wherein each blocking plate has an upper surface and a lower surface, the lower surface of each blocking plate being proximate to said walls of said insulating body when said plate-like blocking frame is in the closed position, and each piece body extends above the upper surface of the blocking plate to which said piece body is attached.

13. The combination according to claim 10, further including a guiding plate attached to each said abutting portion, each said guiding plate being angled relative to said respective abutting portion, each said guiding portion contacting the respective side edge of the chip module during movement of the plate-like blocking frame from the open position to the closed position.

14. The combination according to claim 10, wherein each said piece body has first and second ends, and the abutting portion extends from one of said ends of the respective piece body.

15. The combination according to claim 14, wherein each said abutting portion is formed at the end of the respective piece body which is adjacent to each other.

16. The combination according to claim 14, wherein each said abutting portion is formed at the end of the respective piece body which is not adjacent to each other.

17. The combination according to claim 10, further including a chamfer between two of said walls in said insulating body and said chip module has a chamfer, wherein when said chip module is inserted into said insulating body, said chamfer on said chip module is inserted into said chamfer in said insulating body

* * * * *